(12) United States Patent
Choi et al.

(10) Patent No.: US 10,249,552 B2
(45) Date of Patent: Apr. 2, 2019

(54) SEMICONDUCTOR PACKAGE HAVING DOUBLE-SIDED HEAT DISSIPATION STRUCTURE

(71) Applicant: JMJ KOREA CO., LTD., Gyeonggi-do (KR)

(72) Inventors: Yun Hwa Choi, Gyeonggi-do (KR); Soon Seong Choi, Gyeonggi-do (KR)

(73) Assignee: JMJ Korea Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/895,170

(22) Filed: Feb. 13, 2018

(65) Prior Publication Data
US 2018/0240731 A1     Aug. 23, 2018

(30) Foreign Application Priority Data

Feb. 22, 2017   (KR) .................. 10-2017-0023416

(51) Int. Cl.
*H01L 23/367*     (2006.01)
*H01L 23/498*     (2006.01)
(Continued)

(52) U.S. Cl.
CPC ...... *H01L 23/3675* (2013.01); *H01L 23/3121* (2013.01); *H01L 23/3677* (2013.01);
(Continued)

(58) Field of Classification Search
CPC .......... H01L 23/3675; H01L 23/49833; H01L 23/49811; H01L 23/3121
See application file for complete search history.

(56) References Cited

U.S. PATENT DOCUMENTS

| | | | |
|---|---|---|---|
| 9,555,962 B1 * | 1/2017 | Stravitz | B65F 1/06 |
| 2012/0074586 A1 * | 3/2012 | Seo | H01L 25/16 |
| | | | 257/774 |
| 2015/0235991 A1 * | 8/2015 | Gu | H01L 25/0655 |
| | | | 257/762 |

FOREIGN PATENT DOCUMENTS

| | | | |
|---|---|---|---|
| KR | 100475313 B1 | 3/2005 | |
| KR | 100648509 B1 | 11/2006 | |
| KR | 101461197 B1 | 11/2014 | |

* cited by examiner

*Primary Examiner* — Dung A. Le
(74) *Attorney, Agent, or Firm* — Christensen, Fonder, Dardi & Herbert PLLC; Curtis B. Herbert

(57) ABSTRACT

The present disclosure relates to a semiconductor package having a double-sided heat dissipation structure, and more particularly, to a semiconductor package having a double-sided heat dissipation structure which rapidly transfers high heat generated in a semiconductor chip to substrates exposed to upper and lower surfaces of the package to have excellent dissipation effect.

That is, a semiconductor package having a double-sided heat dissipation structure of the present disclosure includes a package body formed by molding, a first substrate which is provided at an inner lower portion of the package body and has a lower surface exposed to the outside of the package body, a semiconductor chip mounted on an upper surface of the first substrate, a lead frame which is attached to the first substrate and extends to the outside of the package body, a second substrate which is provided at an inner upper portion of the package body and has an upper surface exposed to the outside of the package body, a first metal unit in which one side is bonded to an upper surface of the semiconductor chip and the other side is bonded to a lower surface of the second substrate, and a second metal unit in which one side is (Continued)

bonded to an upper surface of the first substrate and the other side is bonded to the lower surface of the second substrate.

5 Claims, 3 Drawing Sheets

(51) Int. Cl.
    *H01L 23/31*     (2006.01)
    *H01L 23/00*     (2006.01)
    *H01L 25/065*     (2006.01)
    *H01L 23/373*     (2006.01)
    *H01L 23/433*     (2006.01)

(52) U.S. Cl.
CPC ...... *H01L 23/3735* (2013.01); *H01L 23/4334* (2013.01); *H01L 23/49811* (2013.01); *H01L 23/49833* (2013.01); *H01L 24/16* (2013.01); *H01L 25/0655* (2013.01); *H01L 24/32* (2013.01); *H01L 24/48* (2013.01); *H01L 24/73* (2013.01); *H01L 2224/16227* (2013.01); *H01L 2224/2919* (2013.01); *H01L 2224/32225* (2013.01); *H01L 2224/32245* (2013.01); *H01L 2224/33181* (2013.01); *H01L 2224/48227* (2013.01); *H01L 2224/48229* (2013.01); *H01L 2224/73203* (2013.01); *H01L 2224/73215* (2013.01); *H01L 2224/73253* (2013.01); *H01L 2224/73265* (2013.01)

SEMICONDUCTOR PACKAGE HAVING DOUBLE-SIDED HEAT DISSIPATION STRUCTURE

CROSS-REFERENCE TO RELATED APPLICATIONS

This application is based on and claims priority from Korean Patent Application No. 10-2017-0023416, filed on Feb. 22, 2017, with the Korean Intellectual Property Office, the disclosure of which is incorporated herein in its entirety by reference.

The present disclosure relates to a semiconductor package having a double-sided heat dissipation structure, and more particularly, to a semiconductor package having a double-sided heat dissipation structure which rapidly transfers high heat generated in a semiconductor chip to substrates exposed to upper and lower surfaces of the package to have excellent dissipation effect.

BACKGROUND

Generally, a semiconductor package is formed by mounting a semiconductor chip on a substrate and molding a single module of a structure connecting the semiconductor chip and a lead frame by a clip or a bonding wire with a thermosetting material such as an epoxy molding compound (EMC) to form a package body.

The semiconductor package exhausts heat generated from the semiconductor chip mounted in the body by being coupled to a separate heat slug. However, since an amount of generated heat of a highly integrated semiconductor package is large, it is difficult to expect smooth heat exhaust by the heat slug.

Specifically, the semiconductor package is provided in a converter or an inverter connected to a battery of an electric vehicle and in this case, a heat dissipating function of the semiconductor is closely related to an efficiency of the battery.

Related arts trying to improve a heat dissipation effect will be described below.

First, Korean Registered Patent No. 10-0648509 (A tape-type lead frame strip, a lead exposed semiconductor chip package using the same, and a manufacturing method) suggests a technology including a semiconductor chip including a bonding pad, a pattern lead connected to the bonding pad by a wire, and a package body which seals the semiconductor chip, the wire, and the pattern lead and is formed by outwardly exposing a lower portion of the semiconductor chip and a lower portion of the pattern lead.

According to the above-described related art, the heat generated in the semiconductor chip is exhausted only through a lower portion so that the heat dissipation effect is low and the exposed pattern lead is connected by the wire so that the heat is not easily dissipated. That is, the wire is attached by bonding and transmits just an electrical signal but the heat is not transferred to the pattern through the wire so that it is difficult to expect high heat exhaust effect.

Second, Korean Registered Patent No. 10-1461197 (COF type semiconductor chip package having heat dissipation structure) suggests a technology configured by a first heat dissipation resin layer applied between a semiconductor chip and a film and a second heat dissipation resin layer which is applied on the film to be in contact with a side of the semiconductor chip and exposes a top surface of the semiconductor chip to the outside.

According to the above-described related art, the semiconductor chip is disposed on the film to be connected with an electrode pattern through a bump so that heat generated from the semiconductor chip is exhausted only to the exposed upper portion but is not exhausted to the lower portion to which the film is attached. Further, a package body which protects the semiconductor chip and individual configurations is not provided so that it is difficult to be connected using a lead frame or a wire and the semiconductor chip and the configurations are easily damaged by vibration or impact.

Third, Korean Registered Patent No. 10-0475313 (Method for assembling stacked double chip semiconductor package using adhesive tape) suggests a technology including a first step of forming an adhesive layer for die bonding on a chip paddle of a frame material used for a semiconductor package assembling process, a second step of attaching a first semiconductor chip onto the adhesive layer, and a third step of attaching a second semiconductor chip attached with an adhesive tape for die bonding on a bottom surface, above the first semiconductor chip.

The above-described related art is a technology which attaches the first semiconductor chip and the second semiconductor chip by a liquefied epoxy and an adhesive tape. However, this technology is also formed by a stacked structure so that a heat dissipation effect of the semiconductor package is lowered and it is difficult to effectively dispose the semiconductor chip due to the structure.

SUMMARY

The present disclosure has been made in an effort to provide a semiconductor package having a double-sided heat dissipation structure in which one surface of substrates is exposed to upper and lower portions of a package body and an upper surface of a semiconductor chip mounted in a lower substrate and a lower surface of the upper substrate are connected so that heat generated from the semiconductor chip is exhausted not only to the lower substrate, but also to the upper substrate so that the heat dissipation effect is enhanced.

An exemplary embodiment of the present disclosure provides a semiconductor package having a double-sided heat dissipation structure including: a package body formed by molding, a first substrate which is provided at an inner lower portion of the package body and has a lower surface exposed to the outside of the package body, a semiconductor chip mounted on an upper surface of the first substrate, a lead frame which is attached to the first substrate and extends to the outside of the package body, a second substrate which is provided at an inner upper portion of the package body and has an upper surface exposed to the outside of the package body, a first metal unit in which one side is bonded to an upper surface of the semiconductor chip and the other side is bonded to a lower surface of the second substrate, and a second metal unit in which one side is bonded to an upper surface of the first substrate and the other side is bonded to the lower surface of the second substrate.

Here, in a portion at which the lower portion of the first metal unit is bonded to the semiconductor chip by an adhesive, a V-shaped or a U-shaped groove may be further formed to be more firmly bonded and enhance the heat dissipation effect.

Another exemplary embodiment of the present disclosure provides a semiconductor package having a double-sided heat dissipation structure, including: a package body formed by molding, a first substrate which is provided at an inner lower portion of the package body and has a lower surface exposed to the outside of the package body, a lower semiconductor chip mounted on an upper surface of the first substrate, a lead frame which is attached to the first substrate and extends to the outside of the package body, a second substrate which is provided at an inner upper portion of the package body and has an upper surface exposed to the outside of the package body, an upper semiconductor chip mounted on a lower surface of the second substrate, a first metal unit in which one side is bonded to an upper surface of the lower semiconductor chip and a lower surface of the upper semiconductor chip and the other side is bonded to the first and second substrates located at opposite sides, and a second metal unit in which one side is bonded to an upper surface of the first substrate and the other side is bonded to the lower surface of the second substrate in which the first metal units are bonded to the lower semiconductor chip and the upper semiconductor chip, respectively, by an adhesive and are bonded to the first and second substrates located at opposite sides by an ultrasonic welding method, the second metal unit may be bonded to the first substrate by the adhesive and is bonded to the second substrate by the ultrasonic welding method and in a portion at which the lower portion of the first metal unit is bonded to the lower semiconductor by an adhesive and a portion at which the upper portion of the first metal unit is bonded to the upper semiconductor chip by an adhesive, a V-shaped or a U-shaped groove may be further formed to be more firmly bonded and enhance the heat dissipation effect.

According to the exemplary embodiment of the present disclosure, one surface of a first substrate and one surface of a second substrate are exposed to upper and lower portions of a package body to easily exhaust the heat and a semiconductor chip mounted in the first substrate is connected to the second substrate through a metal unit so that the heat generated in the semiconductor chip is exhausted not only to the first substrate but also to the second substrate at an upper portion along the metal unit to have excellent heat dissipation effect.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
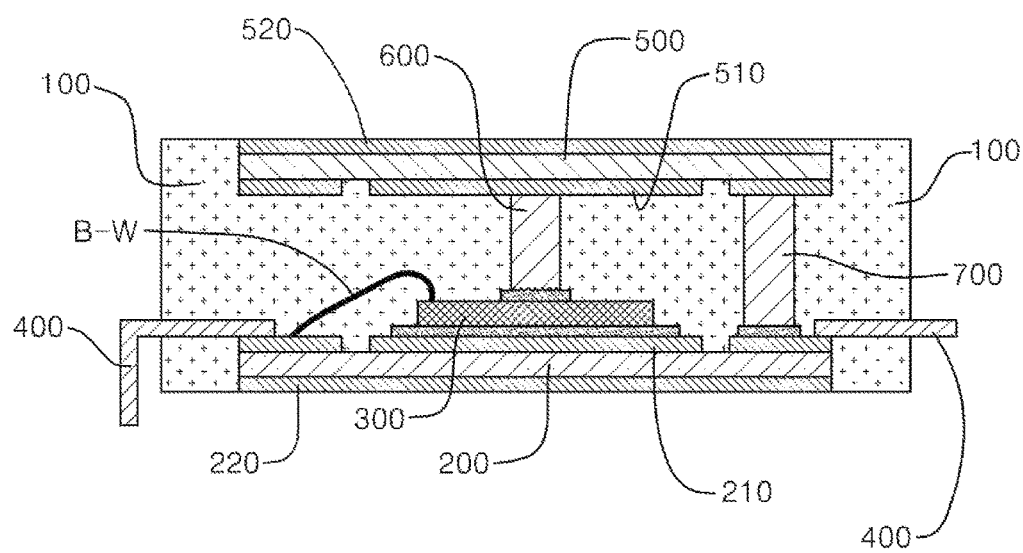
FIG. 1 is a cross-sectional view illustrating a first example of a semiconductor package having a double-sided heat dissipation structure.

In the following detailed description, reference is made to the accompanying drawing, which forms a part hereof. The illustrative embodiments described in the detailed description, drawing, and claims are not meant to be limiting. Other embodiments may be utilized, and other changes may be made, without departing from the spirit or scope of the subject matter presented here.

Hereinafter, preferred embodiments of the present invention will be described in detail as follows with reference to the accompanying drawings. Further, in the description of the present invention, a detailed explanation of known related functions and constitutions may be omitted when it is determined to unnecessarily make the subject matter of the present invention obscure.

A semiconductor package having a double-sided heat dissipation structure of the present disclosure includes a package body 100 formed by molding, a first substrate 200 which is provided at an inner lower portion of the package body 100 and has a lower surface exposed to the outside of the package body 100, a semiconductor chip 300 mounted on an upper surface of the first substrate 200, a lead frame 400 which is attached to the first substrate 200 and extends to the outside of the package body 100, a second substrate 500 which is provided at an inner upper portion of the package body 100 and has an upper surface exposed to the outside of the package body 100, a first metal unit 600 in which one side is bonded to an upper surface of the semiconductor chip 300 and the other side is bonded to a lower surface of the second substrate 500, and a second metal unit 700 in which one side is bonded to the upper surface of the first substrate 200 and the other side is bonded to the lower surface of the second substrate 500.

In the present disclosure, one surface of the first substrate 200 and one surface of the second substrate 500 are exposed to the outside of the package body 100 at upper and lower portions so that heat is easily exhausted through the exposed surface. The semiconductor chip 300 is mounted on the upper surface of the first substrate 200 so that the heat generated from the semiconductor chip 300 is exhausted to the first substrate 200 disposed at a lower portion. Further, the first metal unit 600 connects the upper surface of the semiconductor chip 300 and the lower surface of the second substrate 500 to directly transmit the heat generated from the semiconductor chip 300 also to the second substrate 500 so that the heat is also exhausted to the second substrate 500 disposed at an upper portion. The second metal unit 700 connects the upper surface of the first substrate 200 and the lower surface of the second substrate 500 to transmit the heat of the first substrate 200 to the second substrate 500 so that a double-sided heat exhaust structure is achieved.

The first substrate 200 and the second substrate 500 of the present disclosure may be formed of a material such as ceramic (Al2O3) or an aluminum nitride substrate (AlN) and metal patterns 210 and 510 are formed therein, respectively. The metal patterns 210 and 510 are printed by metal materials and the metal patterns 210 and 510 include a pad in which a data line, a power supply line, and a semiconductor chip 300 are mounted. The outer sides of the first substrate 200 and the second substrate 500 exposed to the package body are configured by metal layers 220 and 520 having high heat conductivity so that one surfaces are exposed to the outside. Further, the first substrate 200 and the second substrate 500 may be configured by three layers as described above, but a substrate configured by one metal layer may also be applied depending on a type of a semiconductor package.

FIG. 1 illustrates a first example of the present disclosure in which a first metal unit 600 and a second metal unit 700 are formed by a vertical-columnar metal post. As described above, when the first metal unit 600 and the second metal unit 700 are formed by a columnar metal post, structurally stable form is provided and effective thermal conduction may be achieved while the metal post does not occupy a large space in the package body 100.

The first metal unit 600 and the second metal unit 700 of the present disclosure may be bonded by different methods depending on a portion to be bonded. That is, upper portions of the first metal unit 600 and the second metal unit 700 which are bonded to the second substrate 500 are bonded by an ultrasonic welding method and lower portions of the first metal unit 600 and the second metal unit 700 which are bonded to the semiconductor chip 300 and the first substrate 200 are bonded by an adhesive.

According to the ultrasonic welding method, the bonding is performed by a separate ultrasonic welding-bonding device (not illustrated) and vibration friction heat is generated by ultrasonic vibration while applying a static load to a surface of a material to be bonded to perform welding with pressure. As described above, the bonding is performed by the ultrasonic welding method so that a bonding quality is improved, the generation of environmental pollutants is suppressed, and productivity is improved by automatic control. Further, in the bonding method using an adhesive, the adhesive may include a conductive solder or an epoxy solder which is generally used.

As described above, when the first metal unit 600 and the second metal unit 700 are bonded to the second substrate 500 located at an upper portion by the ultrasonic welding method and bonded to the semiconductor chip 300 and the first substrate 200 located at a lower portion by an adhesive such as a solder, productivity during the operating process may be increased and completeness of the semiconductor package may be enhanced.

Further, in a lower portion of the first metal unit 600, that is, a portion which is bonded to the semiconductor chip 300 by an adhesive, a V-shaped or a U-shaped groove is further formed to be more firmly bonded and as the surface is increased by the groove, the heat dissipation effect may be further enhanced.

Figure 2:
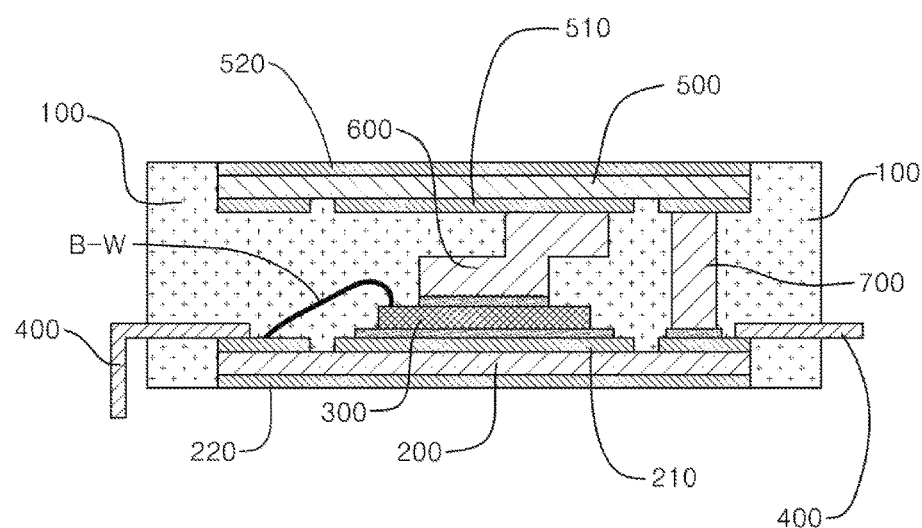
FIG. 2 is a cross-sectional view illustrating a second example of a semiconductor package having a double-sided heat dissipation structure.

FIG. 2 illustrates a second example of the present disclosure in which the first metal unit 600 is formed of a bent metal clip and the second metal unit 700 is configured by a columnar metal post so that the first metal unit and the second metal unit have different shapes. As described above, when the first metal unit 600 is configured by a bent metal clip, a contact area is larger than that of the first example so that the heat conduction is rapidly performed and the heat dissipation effect is excellent.

Figure 3:
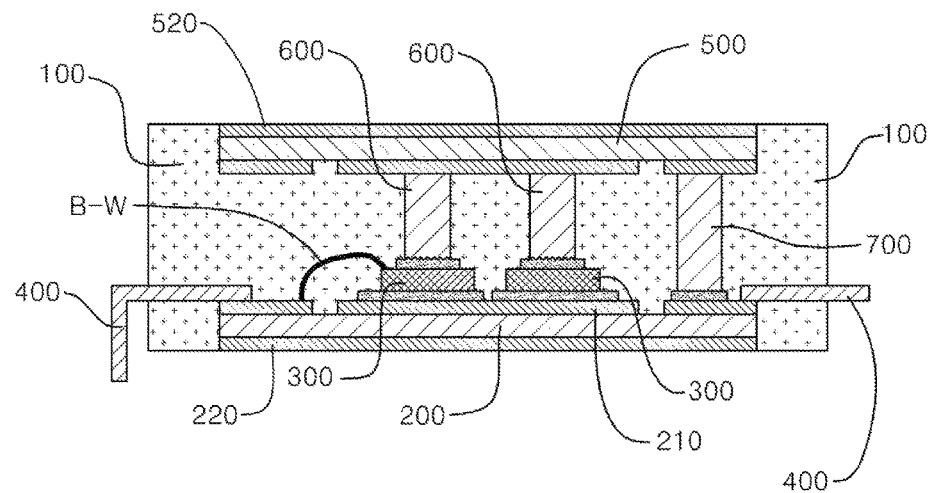
FIG. 3 is a cross-sectional view illustrating a third example of a semiconductor package having a double-sided heat dissipation structure.

The semiconductor chip 300 of the present disclosure is mounted above the metal pattern 210 of the first substrate 200. In this case, the semiconductor chip 300 is bonded by an adhesive such as a solder and as illustrated in FIGS. 1 and 2, one semiconductor chip 300 may be configured. However, as in the third example illustrated in FIG. 3, a plurality of semiconductor chips 300 may be provided on the first substrate 200 and first metal units 600 are also provided so as to correspond to the number of semiconductor chips 300 so that first metal units 600 are bonded to the individual semiconductor chips 300.

Figure 4:
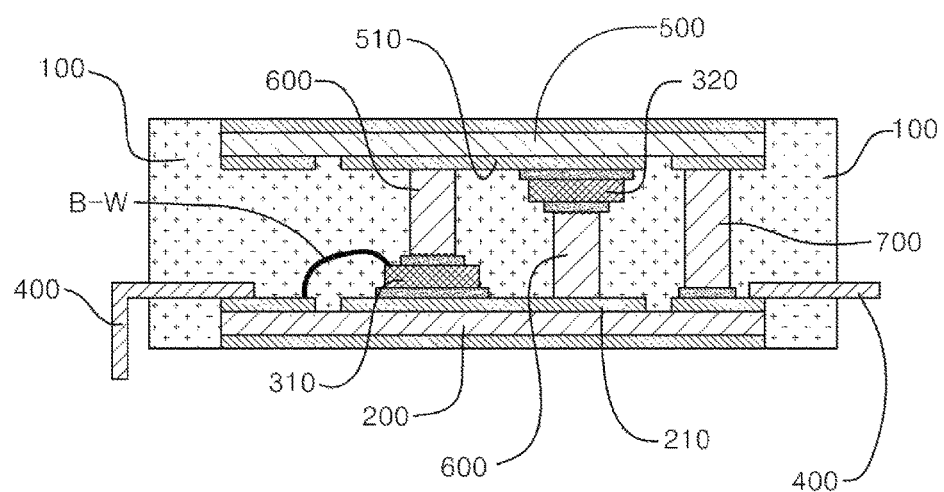
FIG. 4 is a cross-sectional view illustrating a fourth example of a semiconductor package having a double-sided heat dissipation structure.

FIG. 4 illustrates a fourth example of the present disclosure in which a semiconductor package includes a package body 100 formed by molding, a first substrate 200 which is provided at an inner lower portion of the package body 100 and has a lower surface exposed to the outside of the package body 100, a lower semiconductor chip 310 mounted on an upper surface of the first substrate 200, a lead frame 400 which is attached to the first substrate 200 and extends to the outside of the package body 100, a second substrate 500 which is provided at an inner upper portion of the package body 100 and has an upper surface exposed to the outside of the package body 100, an upper semiconductor chip 320 mounted on a lower surface of the second substrate 500, a first metal unit 600 in which one side is bonded to an upper surface of the lower semiconductor chip 310 and a lower surface of the upper semiconductor chip 320 and the other side is bonded to the first and second substrates 200 and 500 located at opposite sides, and a second metal unit 700 in which one side is bonded to an upper surface of the first substrate 200 and the other side is bonded to the lower surface of the second substrate 500.

The fourth example of the present disclosure is configured such that the lower semiconductor chip 310 and the upper semiconductor chip 320 are mounted in the first substrate 200 and the second substrate 500, respectively. As a bonding structure of the fourth example, the first metal units 600 are bonded to the lower semiconductor chip 310 and the upper semiconductor chip 320, respectively, by an adhesive and are bonded to the first and second substrates 200 and 500 located at opposite sides by the ultrasonic welding method. Further, the second metal unit 700 is bonded to the first substrate 200 by the adhesive and is bonded to the second substrate 500 by the ultrasonic welding method. The bonding structure is slightly different from the first, second, and third examples but the technical spirit that the first metal unit 600 is bonded to the semiconductor chip by an adhesive such as a solder is the same as those of the first, second, and third examples.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor package having a double-sided heat dissipation structure, the semiconductor package comprising:
    a package body formed by molding;
    a first substrate which is provided at an inner lower portion of the package body 100 and has a lower surface exposed to the outside of the package body;
    a semiconductor chip mounted on an upper surface of the first substrate;
    a lead frame which is attached to the first substrate and extends to the outside of the package body;
    a second substrate which is provided at an inner upper portion of the package body and has an upper surface exposed to the outside of the package body;
    a first metal unit in which one side is bonded to an upper surface of the semiconductor chip and the other side is bonded to a lower surface of the second substrate; and
    a second metal unit in which one side is bonded to an upper surface of the first substrate and the other side is bonded to the lower surface of the second substrate,
    wherein the upper portions of the first metal unit and the second metal unit are bonded to the second substrate by an ultrasonic welding method, lower portions of the first metal unit and the second metal unit which are bonded to the semiconductor chip and the first substrate are bonded by an adhesive, in a portion at which the lower portion of the first metal unit is bonded to the semiconductor chip by an adhesive, a V-shaped or a U-shaped groove is further formed to be more firmly bonded and enhance a heat dissipation effect.

2. The semiconductor package according to claim 1, wherein the first metal unit 600 and the second metal unit 700 are formed by columnar metal posts.

3. The semiconductor package according to claim 1, wherein the first metal unit 600 is formed by a bent metal clip and the second metal unit 700 is formed by a columnar metal post.

4. The semiconductor package according to claim 1, wherein a plurality of semiconductor chips 300 is provided on the first substrate 200 and the first metal unit 600 is bonded to each semiconductor chip 300.

5. A semiconductor package having a double-sided heat dissipation structure, the semiconductor package comprising:
   a package body 100 formed by molding;
   a first substrate 200 which is provided at an inner lower portion of the package body 100 and has a lower surface exposed to the outside of the package body 100;
   a lower semiconductor chip 310 mounted on an upper surface of the first substrate 200;
   a lead frame 400 which is attached to the first substrate 200 and extends to the outside of the package body 400;
   a second substrate 500 which is provided at an inner upper portion of the package body 100 and has an upper surface exposed to the outside of the package body 100;
   an upper semiconductor chip 320 mounted on a lower surface of the second substrate 500;
   a first metal unit 600 in which one side is bonded to an upper surface of the lower semiconductor chip 310 and a lower surface of the upper semiconductor chip 320 and the other side is bonded to the first and second substrates 200 and 500 located at opposite sides; and
   a second metal unit 700 in which one side is bonded to an upper surface of the first substrate 200 and the other side is bonded to the lower surface of the second substrate 500,
wherein the first metal units 600 are bonded to the lower semiconductor chip 310 and the upper semiconductor chip 320, respectively, by an adhesive and are bonded to the first and second substrates 200 and 500 located at opposite sides by an ultrasonic welding method, the second metal unit 700 is bonded to the first substrate 200 by the adhesive and is bonded to the second substrate 500 by the ultrasonic welding method, and
in a portion at which the lower portion of the first metal unit 600 is bonded to the lower semiconductor chip 310 by the adhesive and a portion at which the upper portion of the first metal unit 600 is bonded to the upper semiconductor chip 320 by the adhesive, a V-shaped or a U-shaped groove is further formed to be more firmly bonded and enhance a heat dissipation effect.

* * * * *